(12) United States Patent
O'Sullivan et al.

(10) Patent No.: US 12,237,857 B2
(45) Date of Patent: Feb. 25, 2025

(54) TIME INTERLEAVED PHASED ARRAY RECEIVERS

(71) Applicant: Adesto Technologies Corporation, Santa Clara, CA (US)

(72) Inventors: Cormac O'Sullivan, Cork (IE); Benjamin Tardivel, Caparica (PT); João Marques, Caparica (PT)

(73) Assignee: Adesto Technologies Corporation

( * ) Notice: Subject to any disclaimer, the term of this patent is extended or adjusted under 35 U.S.C. 154(b) by 409 days.

(21) Appl. No.: 17/410,498

(22) Filed: Aug. 24, 2021

(65) Prior Publication Data

US 2021/0384932 A1 Dec. 9, 2021

Related U.S. Application Data

(63) Continuation of application No. PCT/US2020/019503, filed on Feb. 24, 2020.
(Continued)

(51) Int. Cl.
*H03M 1/10* (2006.01)
*H03F 1/42* (2006.01)
(Continued)

(52) U.S. Cl.
CPC ................ *H04B 1/16* (2013.01); *H03F 1/42* (2013.01); *H03F 3/19* (2013.01); *H03F 3/45475* (2013.01); *H03K 3/011* (2013.01); *H03K 5/04* (2013.01); *H03K 7/08* (2013.01); *H03M 1/1215* (2013.01); *H03M 1/128* (2013.01); *H03M 1/662* (2013.01); *H04B 1/126* (2013.01); *H04B 1/18* (2013.01); *H04B 7/043* (2013.01);
(Continued)

(58) Field of Classification Search
CPC .. H03M 1/121; H03M 1/1215; H03M 1/1028; H03M 1/0626; H03M 1/1004; H03M 1/12; H03M 1/124; H03M 1/1245; H03M 1/46; H03M 1/00; H03M 1/002; H03M 1/0836; H03M 1/1009; H03M 1/1019; H03M 1/1205
USPC .......................... 341/118–120, 139–145, 155
See application file for complete search history.

(56) References Cited

U.S. PATENT DOCUMENTS

6,029,052 A 2/2000 Isberg
6,894,630 B1 * 5/2005 Massie ................ H03M 1/0626
341/118
(Continued)

*Primary Examiner* — Linh V Nguyen (57) ABSTRACT

A phased array receiver can include a plurality of antennas, a plurality of compound analog-to-digital converters and a beam former. The plurality of antennas can be arranged in an array. The plurality of compound analog-to-digital converters can include respective inputs coupled to respective ones of the plurality of antennas. Respective output of the plurality of compound analog-to-digital converters can be coupled to the beam former. Each compound analog-to-digital converter can include a plurality of time interleaved sub-analog-to-digital converters. Sampling by the sub-analog-to-digital converters can be random between the sub-analog-to-digital converters within respective compound analog-to-digital converters and random between the plurality of compound analog-to-digital converters. In addition, (Continued)

dynamic element mismatch using a random bitstream generator can be employed in digital-to-analog converters and analog-to-digital converters.

13 Claims, 11 Drawing Sheets

Related U.S. Application Data (60) Provisional application No. 62/851,489, filed on May 22, 2019.

(51) Int. Cl.
| | | |
|---|---|---|
| *H03F 3/19* | (2006.01) | |
| *H03F 3/45* | (2006.01) | |
| *H03K 3/011* | (2006.01) | |
| *H03K 5/04* | (2006.01) | |
| *H03K 7/08* | (2006.01) | |
| *H03M 1/12* | (2006.01) | |
| *H03M 1/66* | (2006.01) | |
| *H04B 1/12* | (2006.01) | |
| *H04B 1/16* | (2006.01) | |
| *H04B 1/18* | (2006.01) | |
| *H04B 7/0426* | (2017.01) | |

(52) U.S. Cl.
CPC .... *H03F 2200/294* (2013.01); *H03F 2200/36* (2013.01); *H03F 2200/451* (2013.01)

(56) References Cited

U.S. PATENT DOCUMENTS

| | | | | |
|---|---|---|---|---|
| 7,227,479 | B1* | 6/2007 | Chen | H03M 1/1004 |
| | | | | 341/169 |
| 8,604,954 | B2* | 12/2013 | Chen | H03M 1/1009 |
| | | | | 341/120 |
| 8,736,476 | B2* | 5/2014 | Gong | H03M 1/0673 |
| | | | | 341/145 |
| 9,294,112 | B1* | 3/2016 | Devarajan | H03M 1/0836 |
| 9,735,799 | B1* | 8/2017 | Nguyen | H03M 1/06 |
| 9,793,910 | B1* | 10/2017 | Devarajan | H03M 1/124 |
| 2008/0057899 | A1 | 3/2008 | Montemayor | |
| 2010/0158138 | A1 | 6/2010 | Ryu | |
| 2015/0372698 | A1* | 12/2015 | Talty | H04B 1/001 |
| | | | | 370/328 |
| 2016/0049949 | A1* | 2/2016 | Waltari | H03M 1/1023 |
| | | | | 341/120 |
| 2016/0079994 | A1* | 3/2016 | Lee | H03M 1/46 |
| | | | | 341/118 |
| 2016/0149582 | A1* | 5/2016 | Ragab | H03M 1/121 |
| | | | | 341/120 |
| 2016/0218893 | A1 | 7/2016 | Waheed | |
| 2017/0117914 | A1* | 4/2017 | Choi | H03M 1/1033 |
| 2021/0305992 | A1* | 9/2021 | Sundström | H03M 1/0673 |
| 2022/0006465 | A1* | 1/2022 | Yu | H03M 1/68 |
| 2022/0416800 | A1* | 12/2022 | Clara | H03M 1/145 |

\* cited by examiner

1210
Configuring one or more parameters of a first set of component of random time interleave analog-to-digital converters associated with correlated signals for a first dynamic range 1220
Configuring one or more parameters of a first set of components of random time interleave analog-to-digital converters associated with uncorrelated signals for a second dynamic range, wherein the first dynamic range is greater than the second dynamic range

FIG. 12

TIME INTERLEAVED PHASED ARRAY RECEIVERS

CROSS-REFERENCE TO RELATED APPLICATIONS

This is a continuation of PCT Patent Application No. PCT/US2020/019503 filed Feb. 24, 2020, which claims the benefit of U.S. Provisional Patent Application No. 62/851,489 filed May 22, 2019, which are incorporated herein in their entirety.

BACKGROUND OF THE INVENTION

Figure 1A:
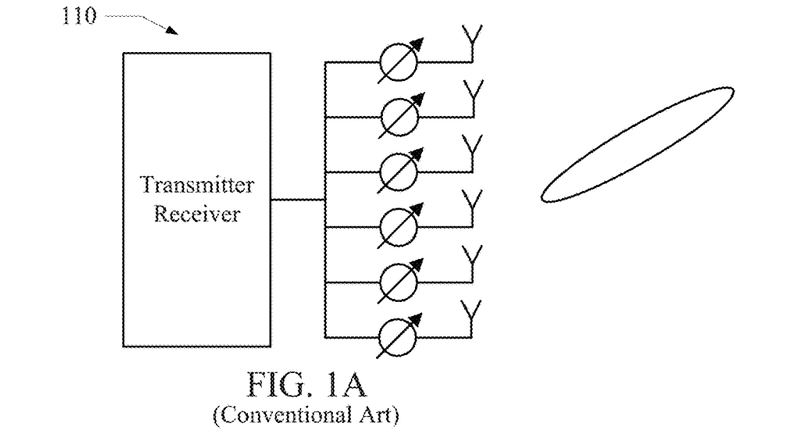
FIGS. 1A, 1B and 1C show exemplary analog, hybrid and digital beamforming phased arrays according to the conventional art.
Figure 1B:
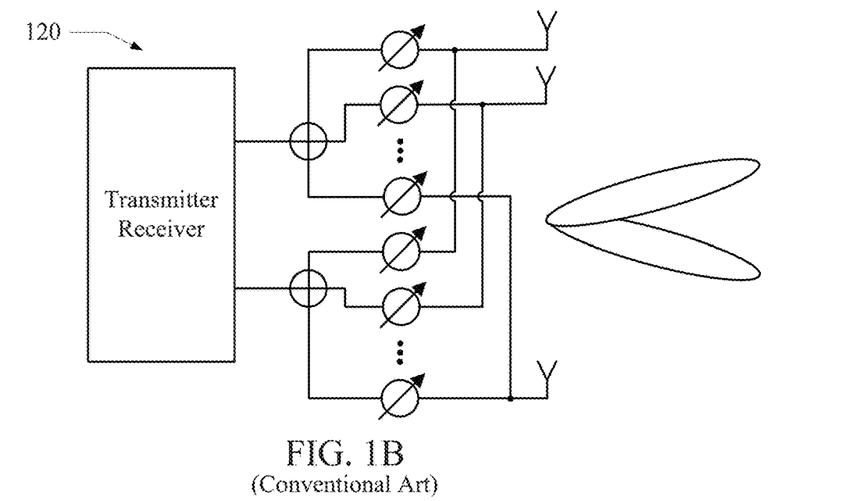
Figure 1C:
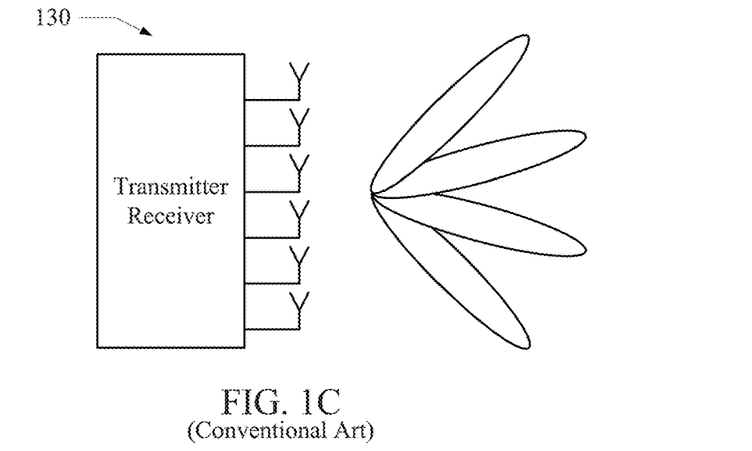

A phased array system can include two or more spatially arranged antennas utilized to transmit and receive signals. The signals from the antennas can be combined or processed in order to achieve improved performance, such as increased overall gain, provide diversity reception, cancel out interference from one or more particular directions, steer the array so that it is most sensitive in a particular direction, determine the direction of arrival of the incoming signals, increase the signal-to-interference plus noise ratio (SINR), direct transmission in a predetermined direction, steer transmitted signals to point in different directions, and or the like. Phased array antennas can be used in radio communications, mobile and or fixed wireless broadband access, satellite, radar, and the like. Phased arrays can take multiple forms, that can include analog beamforming phased arrays 110 as illustrated in FIG. 1A, hybrid beamforming phased arrays 120 as illustrated in FIG. 1B, and digital beamforming phased arrays 130 as illustrated in FIG. 1B. In an analog beamforming phased array 110, phase shifting or time delays can be applied to steer the antenna beam. The analog beamforming phased array 110 provides for one beam per unit time per polarization for the entire frequency band. The analog beamforming phased array 110 generates one beam per antennal array. In a hybrid beamforming phased array 120, a plurality of subarrays are combined together. The subarrays allow clusters of simultaneous beams. The hybrid beamforming phased array 120 provides for a few beam per time unit. The hybrid beamforming phased array 120 is not adaptable to multi-path or frequency-selective fading. In a digital beamforming phased array 130, the signals of each antenna can be digitally processed to enable multiple simultaneous antenna beams to be formed. The digital beamforming phased array 130 provides full flexibility, including multiple beams per time unit, adaptable to multi-path, frequency-selective fading, and serving multiple users each with an individual beam simultaneously.

Figure 2:
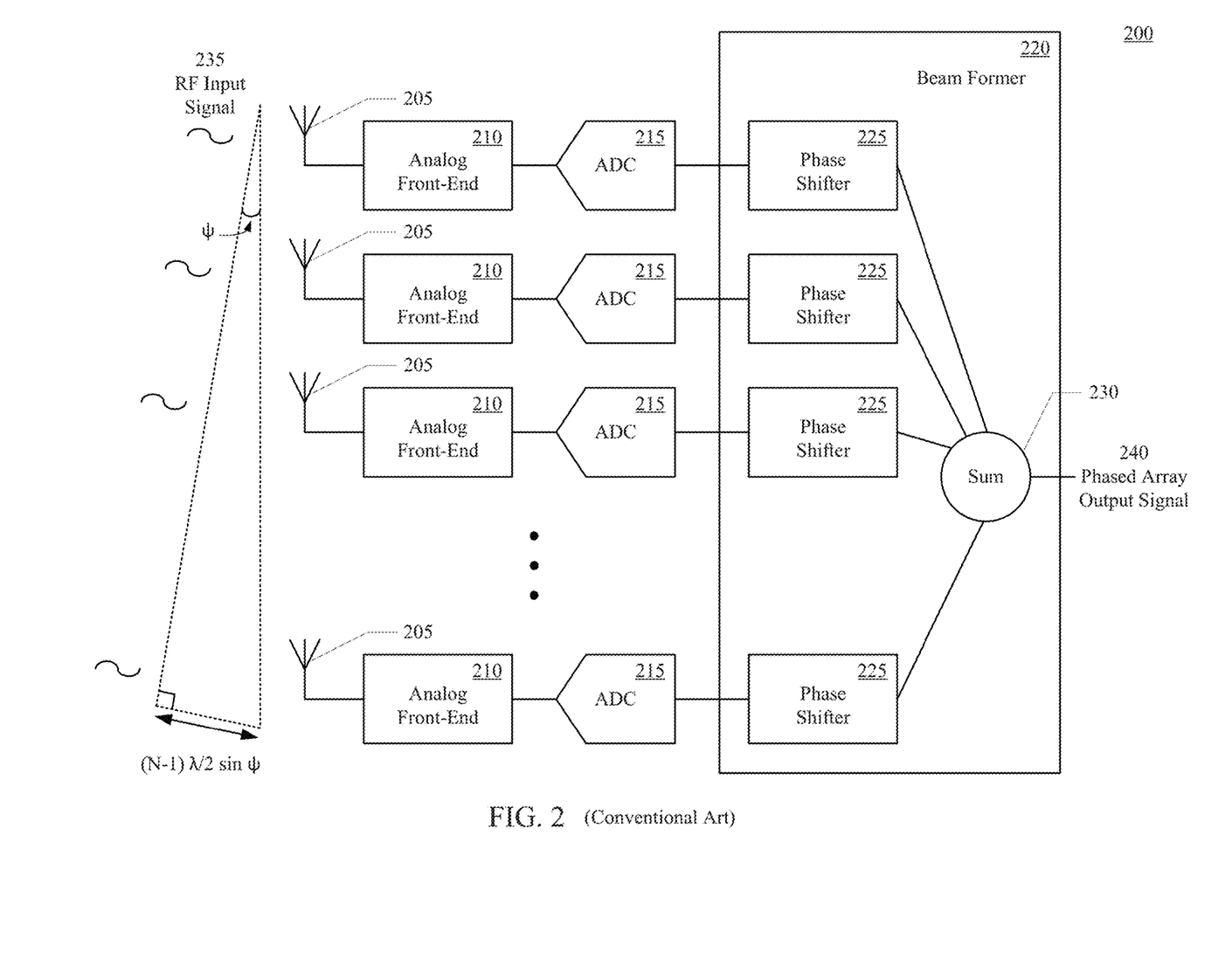
FIG. 2 shows a phased array receiver according to the conventional art.
Figure 3:
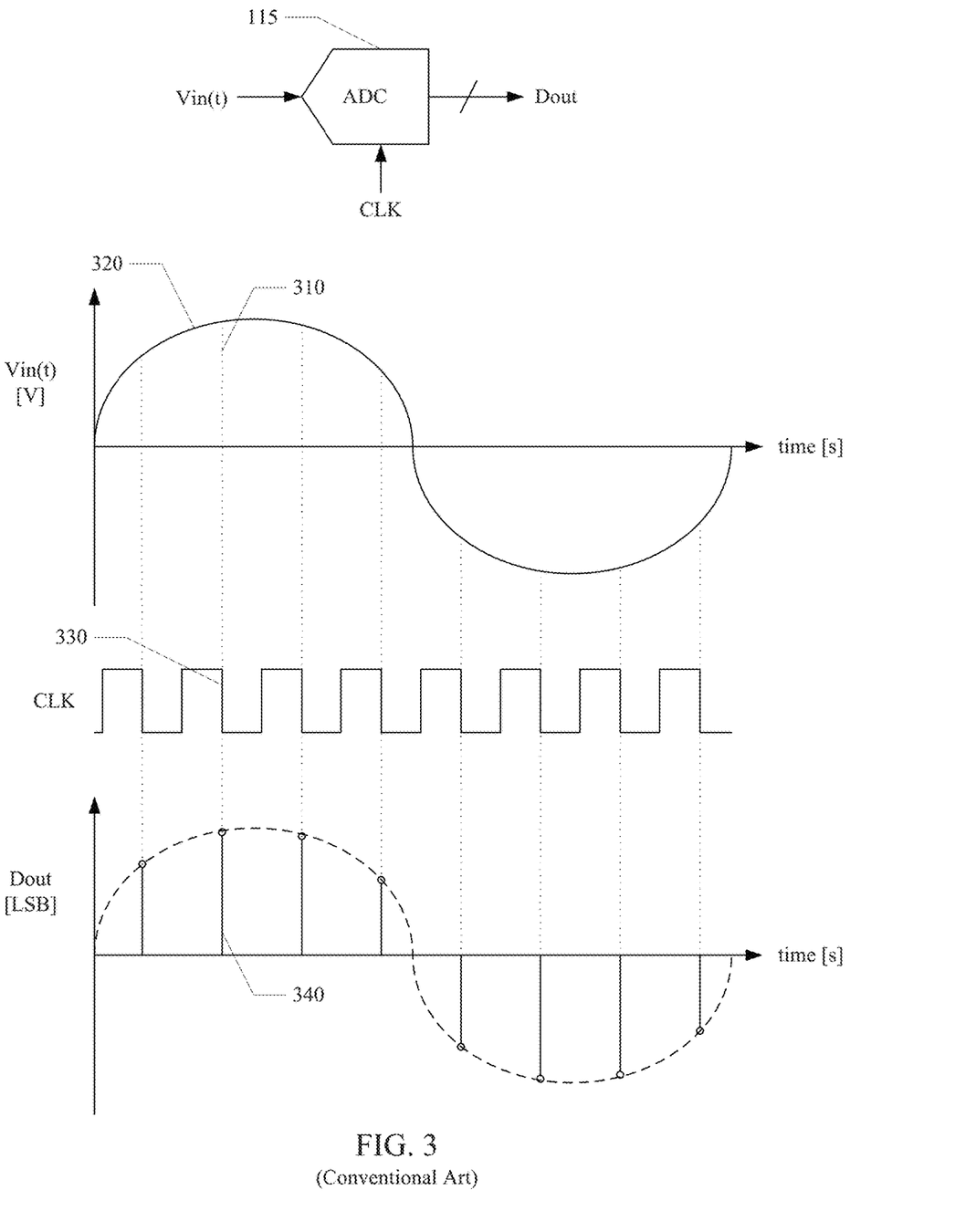
FIG. 3 shows an exemplary timing diagram of quantization of an input signal by an analog-to-digital converter according to the conventional art.

Referring to FIG. 2, a phased array receiver according to the conventional art is shown. The phased array receiver 200 can include a plurality of antennas 205, a plurality of analog front-end circuits 210, a plurality of analog-to-digital converters 215, and a beam former 220. The plurality of antennas 205 can be arranged in an antenna array configured to receive input signals 235 incident from various angles. A given input signal can therefore arrive at respective antennas 205 at different times due to the varying distance between the antennas 205 and the source of the given input signal 235. The analog front-end circuits 210 can include amplifiers, mixers, filters, analog phase shifters and or the like. The analog-to-digital converters 215 can sample the analog input signal 235 and generate quantized values for input to the beam former 220, as illustrated in FIG. 3. For example, each analog-to-digital converter 125 can sample 310 the input signal Vin(t) 320 at a falling edge 330 of a clock signal CLK. The analog-to-digital converter can generate a quantized signal Dout 340 during a low level of the clock signal CLK.

Referring again to FIG. 2, the beam former 220 can include phase shifters or time delays 225, summers 230 and or the like. The phase shifters or time delays 225 of the beam former 220 can shift the quantized values. The phase shifted or time delayed quantized values can be combined by the summer 230 of the beam former 220 to produce a phased array output signal 240. The analog-to-digital converters 215 can have an upper operating frequency limit because a finite amount of time is needed to quantize the sampled signal. In addition, the phased array receiver 200 can exhibit errors due to offset, gain error, clock-skew, finite bandwidth mismatches and the like between the plurality of analog-to-digital converters 215. Accordingly, there is a continuing need for an improved phased array receiver 200.

SUMMARY OF THE INVENTION

The present technology may best be understood by referring to the following description and accompanying drawings that are used to illustrate embodiments of the present technology directed toward time interleaved phased array receiver circuits, phase array transmitter circuits and other similar receiver and transmitter circuits utilizing time interleaved analog-to-digital converters and or digital-to-analog converters.

In one embodiment, a system can include an analog-to-digital signal path or a digital-to analog signal path. One or more substantially correlated parameters of the signal path can be configured at a first dynamic range level and one or more substantially uncorrelated parameters of the signal path can be configured at a second dynamic range level. The first dynamic range level can be greater than the second dynamic range level.

In another embodiment, a system can include analog-to-digital converters. A control circuit can be configured to control time interleaving of the analog-to-digital converters based on a random or pseudo random generated number. In one implementation the random or pseudo random number can be generated based on random noise in the signal path of the analog-to-digital converters.

In another embodiment, a phased array receiver can include a plurality of antennas, a beam former and a plurality of compound analog-to-digital converters (ADCs) coupled between the plurality of antennas and the beam former. The plurality of compound analog-to-digital converters can include respective inputs coupled to respective ones of the plurality of antennas, and respective outputs coupled to the beam former. Each compound analog-to-digital converter can include a plurality of time interleaved sub-analog-to-digital converters, a plurality of switching elements and a multiplexor. The plurality of switching elements can be coupled between the input of the respective compound analog-to-digital converter and inputs of the plurality of time interleaved sub-analog-to-digital converters. The multiplexor can be coupled between the outputs of the plurality of time interleaved sub-analog-to-digital converters and the output of the respective compound analog-to-digital converter. The sampling by the plurality of sub-analog-to-digital converters can be random within respective compound analog-to-digital converters and can be random between the plurality of compound analog-to-digital converters.

In another embodiment, a phased array receiver can include a plurality of antennas, a beam former and a plurality of sets of time interleaved analog-to-digital converters. The inputs of the time interleaved analog-to-digital converters in respective sets can be coupled to respective antennas. The outputs of the time interleaved analog-to-digital converters can be coupled to the beam former. The sampling by the analog-to-digital converters can be random between the time interleaved analog-to-digital converters within sets and random between the plurality of sets.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

BRIEF DESCRIPTION OF THE DRAWINGS

Embodiments of the present technology are illustrated by way of example and not by way of limitation, in the figures of the accompanying drawings and in which like reference numerals refer to similar elements and in which.

DETAILED DESCRIPTION OF THE INVENTION

Reference will now be made in detail to the embodiments of the present technology, examples of which are illustrated in the accompanying drawings. While the present technology will be described in conjunction with these embodiments, it will be understood that they are not intended to limit the invention to these embodiments. On the contrary, the invention is intended to cover alternatives, modifications and equivalents, which may be included within the scope of the invention as defined by the appended claims. Furthermore, in the following detailed description of the present technology, numerous specific details are set forth in order to provide a thorough understanding of the present technology. However, it is understood that the present technology may be practiced without these specific details. In other instances, well-known methods, procedures, components, and circuits have not been described in detail as not to unnecessarily obscure aspects of the present technology.

Some embodiments of the present technology which follow are presented in terms of routines, modules, logic blocks, and other symbolic representations of operations on data within one or more electronic devices. The descriptions and representations are the means used by those skilled in the art to most effectively convey the substance of their work to others skilled in the art. A routine, module, logic block and/or the like, is herein, and generally, conceived to be a self-consistent sequence of processes or instructions leading to a desired result. The processes are those including physical manipulations of physical quantities. Usually, though not necessarily, these physical manipulations take the form of electric or magnetic signals capable of being stored, transferred, compared and otherwise manipulated in an electronic device. For reasons of convenience, and with reference to common usage, these signals are referred to as data, bits, values, elements, symbols, characters, terms, numbers, strings, and/or the like with reference to embodiments of the present technology.

It should be borne in mind, however, that all of these terms are to be interpreted as referencing physical manipulations and quantities and are merely convenient labels and are to be interpreted further in view of terms commonly used in the art. Unless specifically stated otherwise as apparent from the following discussion, it is understood that through discussions of the present technology, discussions utilizing the terms such as "receiving," and/or the like, refer to the actions and processes of an electronic device such as an electronic computing device that manipulates and transforms data. The data is represented as physical (e.g., electronic) quantities within the electronic device's logic circuits, registers, memories and/or the like, and is transformed into other data similarly represented as physical quantities within the electronic device.

In this application, the use of the disjunctive is intended to include the conjunctive. The use of definite or indefinite articles is not intended to indicate cardinality. In particular, a reference to "the" object or "a" object is intended to denote also one of a possible plurality of such objects. It is also to be understood that the phraseology and terminology used herein is for the purpose of description and should not be regarded as limiting.

Embodiments of the present invention are described herein with reference to time interleaved analog-to-digital converters. However, the present invention can also be readily extended to dynamic element matching in digital-to-analog converters. Embodiments of the present invention are also described herein with reference to phased array receivers. However, the present invention can also be readily extended to phased array transmitters, or other systems employing time interleaved analog-to-digital converters and or dynamic element matched digital-to-analog converters.

Figure 4:
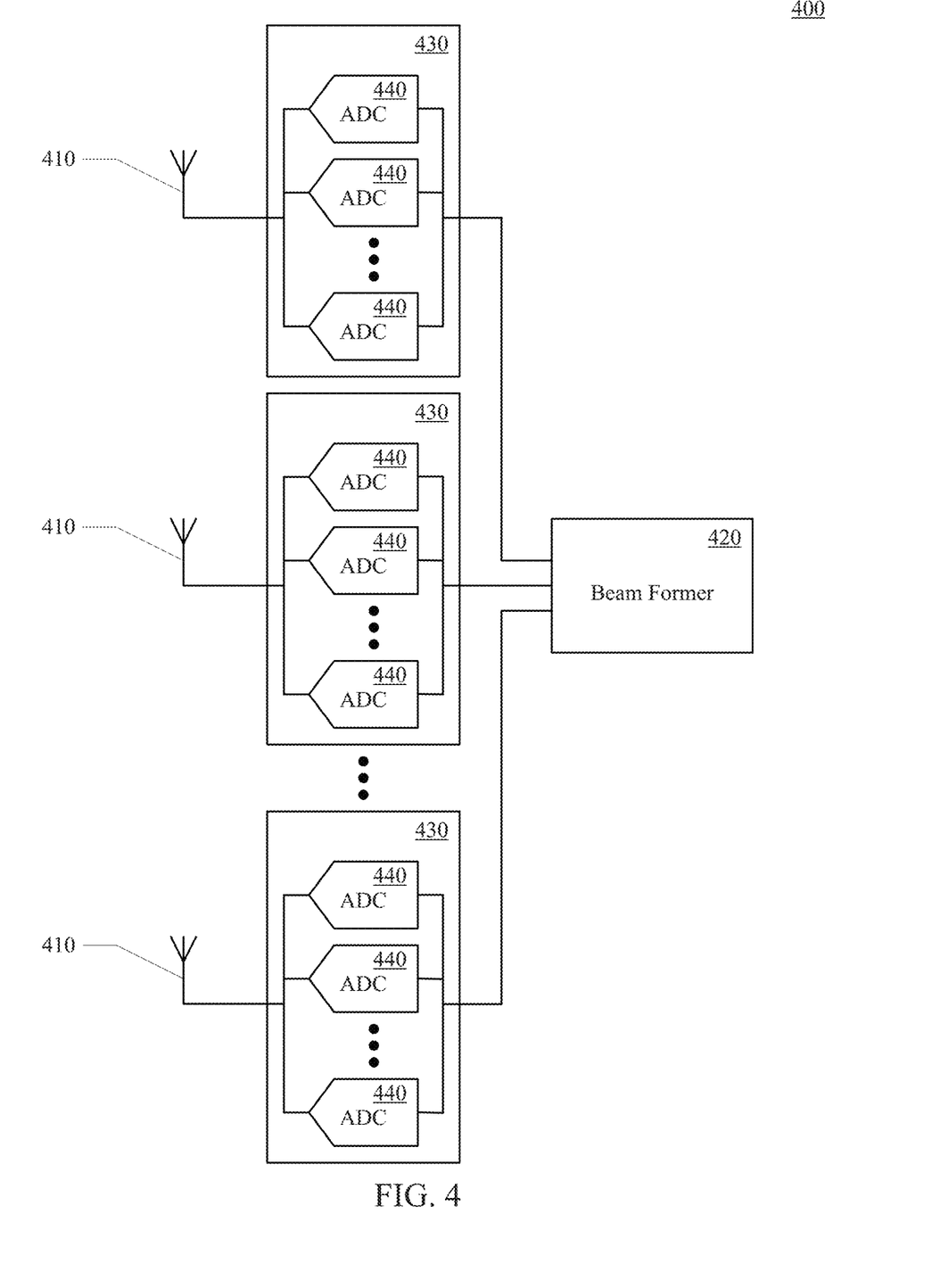
FIG. 4 shows a phased array receiver, in accordance with embodiments of the present invention.

Referring now to FIG. 4, a phased array receiver, in accordance with embodiments of the present invention, is shown. The phased array receiver 400 can include a plurality of antennas 410, a beam former 420, and a plurality of compound analog-to-digital converters 430. The phased array receiver 400 can include numerous other sub-circuits that are not necessary for an understanding of aspects of the present invention, and therefore are not described herein.

The plurality of antennas 410 can be arranged in an array. The inputs of the compound analog-to-digital converters 430 can be coupled to respective antennas 410. The outputs of the compound analog-to-digital converters 430 can be coupled to the beam former 420. The compound analog-to-digital converters 430 can include a plurality of sub-analog-to-digital converters 440. In one implementation, the sub-analog-to-digital converters 440 can be successive approximation register analog-to-digital converters. The sub-analog-to-digital converters 440 can convert an analog signal on the input of the respective compound analog-to-digital converter 430 to a quantized signal. The conversion of the signals on the respective inputs by the sub-analog-to-digital converters 440 can be random between the sub-analog-to-digital converters 440 within respective compound analog-to-digital converters 430. The conversion of signals on the respective inputs can also be random between the plurality of compound analog-to-digital converters 430. Accordingly, sampling of the input signals can be randomly time interleaved across the plurality of sub-analog-to-digital converters 440 of respective compound analog-to-digital converters 430, and random across the plurality of compound analog-to-digital converters 430. In one implementation, the random conversion by the plurality of sub-analog-to-digital converters 440 within a compound analog-to-digital converter 430 can be orthogonal to the random conversion by the sub-analog-to-digital converters 440 within the other compound analog-to-digital converters 430. The random conversion can be orthogonal by employing different random or pseudo random sampling sequences of sub-analog-to-digital converters 440 between the different compound analog-to-digital converters 430.

The quantized signals of the sub-analog-to-digital converters 440 of respective compound analog-to-digital converters 430 can be interleaved to produce time interleaved output signals of each respective compound analog-to-digital converter 430 that are provided to the beam former 420. Mismatches between the sub-analog-to-digital converters 440 can occur due to non-ideal effects such as offset, gain error, clock-skew, finite bandwidth mismatch and the like. However, when conversion of the respective inputs is random between the sub-analog-to-digital converters 440 within respective compound analog-to-digital converters 430 and random between the compound analog-to-digital converters 430, the mismatches between the sub-analog-to-digital converters 430 give rise to a random error signal. Furthermore, the energy of the random error signal is spread across the noise floor of the combined compound analog-to-digital converters 430.

The quantized signals of the sub-analog-to-digital converters 440 are substantially correlated and therefore add in phase or add root mean square statistically. In one implementation, the substantially correlated quantized signals of the sub-analog-to-digital converters 440 can add in $20*\log_{10}(x)$. At the output of the compound analog-to-digital converters 430, the error signal due to mismatches between the sub-analog-to-digital converters 440 are, in contrast, substantially uncorrelated between each other, and for example can add in $10*\log_{10}(x)$.

Figure 5A:
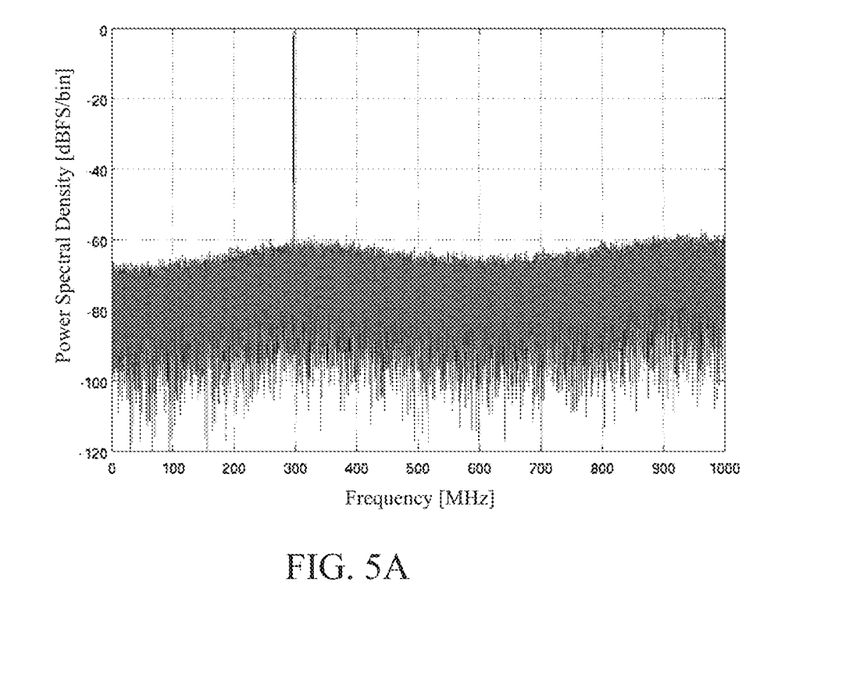
FIGS. 5A and 5B illustrate an output spectra of an exemplary phased array receiver, in accordance with aspects of the present technology.
Figure 5B:
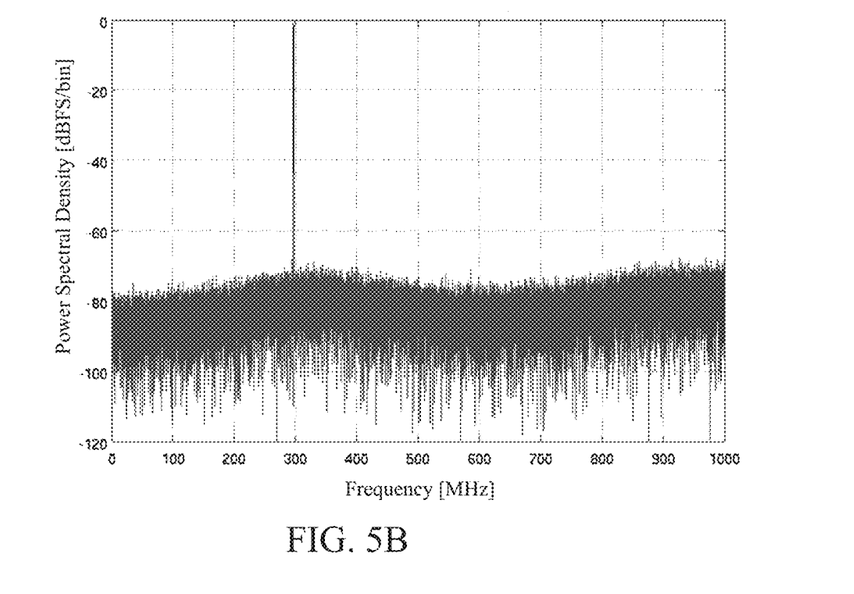

Referring now to FIGS. 5A and 5B, a power spectra of stages within an exemplary phased array receiver, in accordance with aspects of the present technology, is illustrated. FIG. 5A illustrates the power spectra of a plurality (L) of compound analog-to-digital converters 430, each of them comprised of a plurality (M) of sub-analog-to-digital converters 440. In the illustrated example, the phased array receiver includes eight compound analog-to-digital converters 430, and four sub-analog-to-digital converters 440 within each compound analog-to-digital converter 440 FIG. 5B illustrates the output spectrum of the from the beam former 420. From the output of a given compound analog-to-digital converters 430 to the output of the beam former 420, there is a log 2 (num_of_elements)×3 dB signal-to-noise ratio (SNR) improvement, as the error from one compound analog-to-digital converter 430 to another is substantially uncorrelated (e.g., add in $10*\log_{10}(x)$) when randomly sequenced. For example, the eight element random sequenced compound analog-to-digital converter phased array receiver can provide a 9 dB SNR improvement.

Figure 6A:
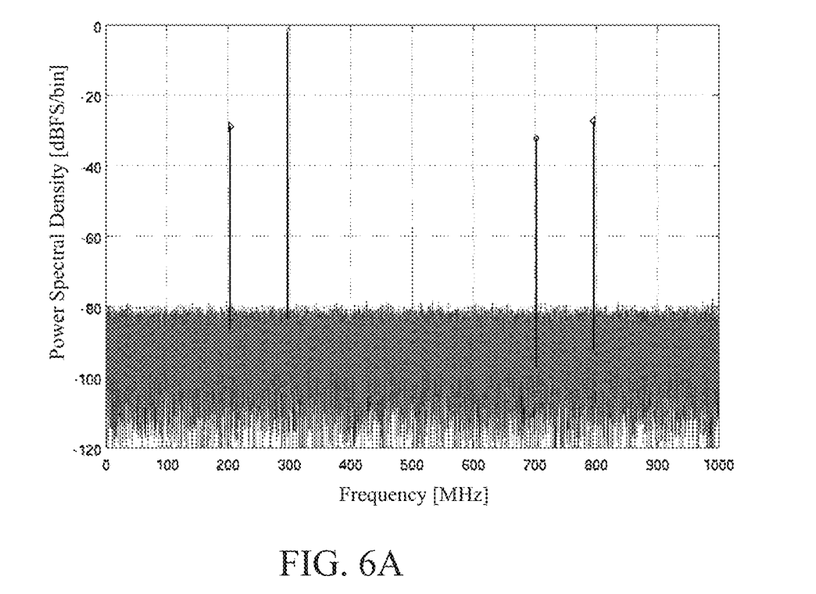
FIGS. 6A and 6B illustrate an output spectra of an exemplary deterministic time interleaved phased array according to the conventional art.
Figure 6B:
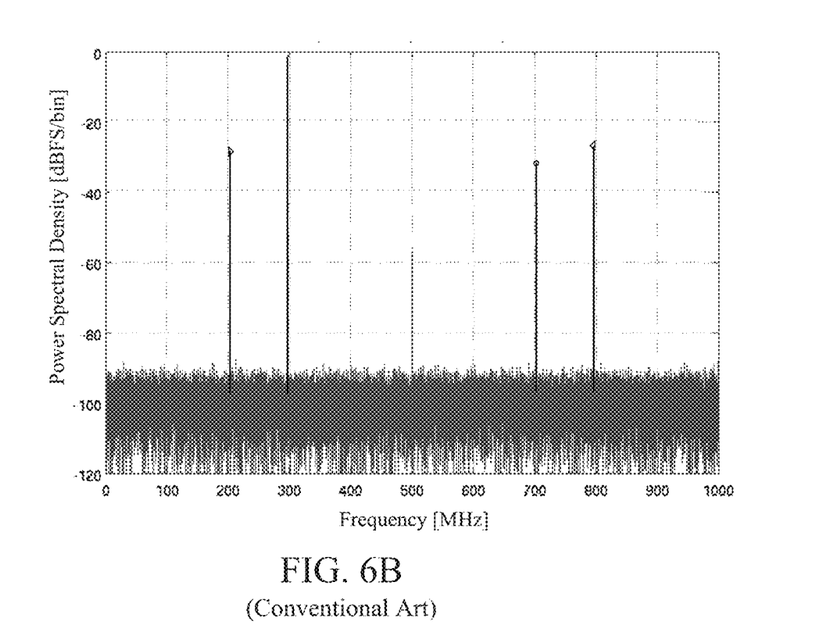

In contrast, when a deterministic sampling sequence (i.e., 1, 2 . . . , M) is used, the mismatches between the sub-analog-to-digital converters gives rise to a periodic error signal. The time interleave mismatch spurs are substantially correlated to the input signal and the clock signal which are common to all sub-analog-to-digital converters and therefore appear as substantially correlated noise between the sub-analog-to-digital converters. The energy of the periodic error signal is therefore concentrated at several spurious components. The time interleave spurs can appear at k*Fs/M+/−Fin Hertz (Hz), where Fs is the clock frequency, Fin is the signal frequency, M is the number of sub-analog-to-digital converters within the respective compound analog-to-digital converters and k is all integers between 1 and M−1. Therefore, both the quantized signal and the error signal due to mismatches between sub-analog-to-digital converters are substantially correlated and add in phase or root mean square statistically (e.g., $20*\log_{10}(x)$). Referring now to FIGS. 6A and 6B, a power spectra of stages within an exemplary deterministic time interleaved phased array is illustrated. FIG. 6A illustrates the power spectra of a plurality (L) of compound analog-to-digital converter, each of them comprised of a plurality (M) of sub-analog-to-digital converters. In the illustrated example, the phased array receiver includes eight compound analog-to-digital converters, and four sub-analog-to-digital converters within each compound analog-to-digital converter. FIG. 6B illustrates the output spectrum of the beamformer when a deterministic sampling sequence is used. From the output of a given compound analog-to-digital converter to the output of a beam former, there is no SNR improvement, as the error from one deterministic time interleaved analog-to-digital converter to another is substantially correlated (e.g., adds in $20*\log_{10}(x)$).

Figure 7:
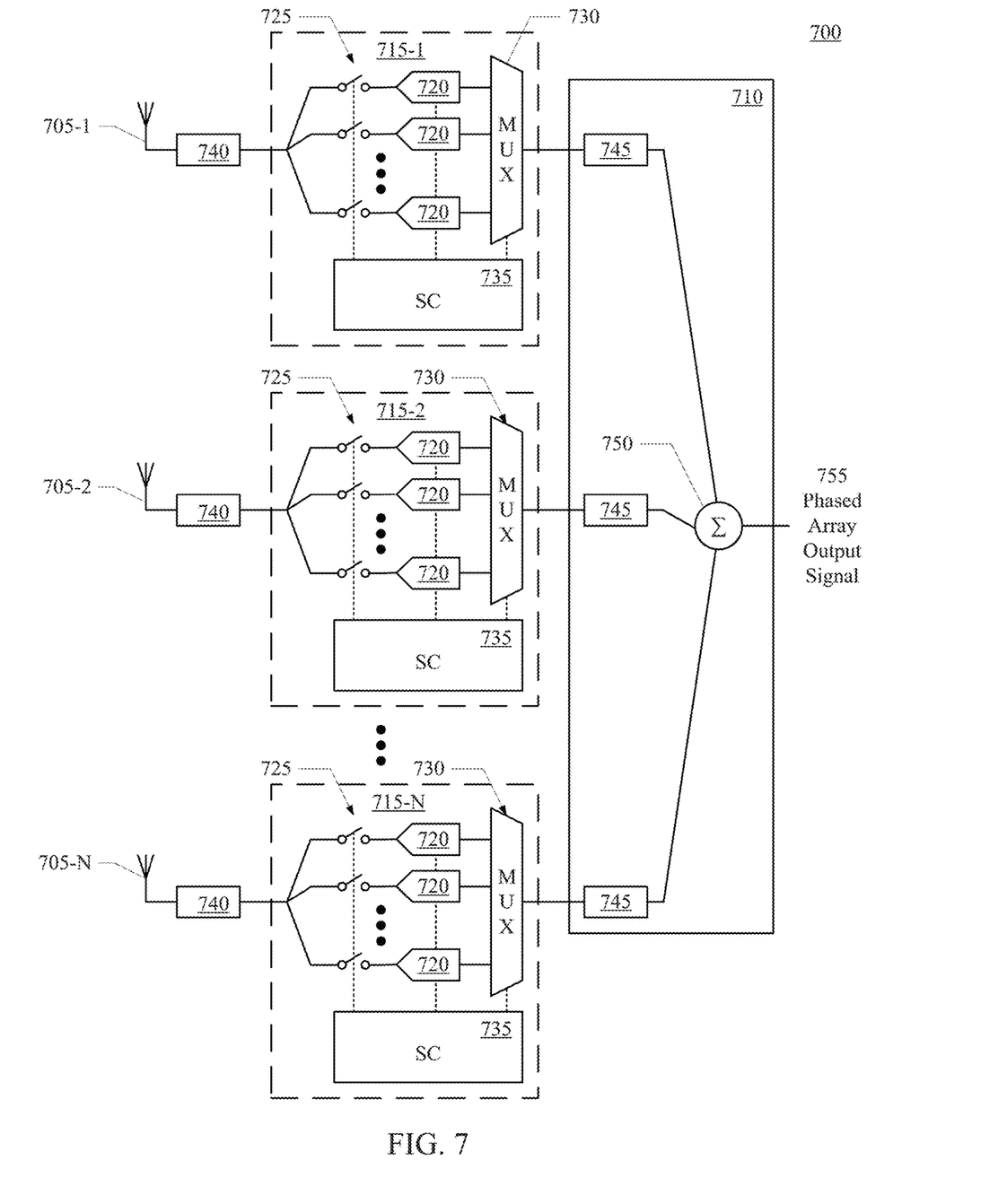
FIG. 7 shows a phased array receiver, in accordance with embodiments of the present invention.

Referring now to FIG. 7, a phased array receiver, in accordance with embodiments of the present invention, is shown. The phased array receiver 700 can include a plurality of antennas 705, a beam former 710 and a plurality of sets 715 of time interleaved analog-to-digital converters 720. In one implementation, the time interleaved analog-to-digital converters 720 can be successive approximation register analog-to-digital converters. In one implementation, each set 715 of time interleaved analog-to-digital converters 720 can represent a respective compound analog-to-digital converter. The phased array receiver 700 can also include sets of switching elements 725, multiplexors 730 and sampling control sub-circuits 735 associated with respective time interleaved analog-to-digital converter sets 715. The phased array receiver 700 can also include numerous other sub-circuits such as amplifiers 740, filters, mixers and the like that are not necessary for an understanding of aspects of the present invention and therefore are not described in detail herein. Similarly, the antennas 705 and beam former 710 are not described in detail herein because such a description is not necessary to an understanding of aspects of the present invention.

The inputs of the time interleaved analog-to-digital converters 720 in respective sets 715 can be coupled to respective antennas 705. For example, the inputs of the time interleaved analog-to-digital converters 720 of a first set 715-1 can be coupled to a first antenna 705-1. The inputs of the time interleaved analog-to-digital converters 720 of an Nth set 715-N can be coupled to an Nth antenna 705-N. In one implementation, the inputs of the time interleaved analog-to-digital converters 720 in respective sets 715 can be coupled to respective antennas 705 by respective sets of switching elements 725.

Although embodiments of the present invention are illustrated with N sets of time interleaved analog-to-digital converters 715 coupled to N antennas 705, in other embodiments different numbers of sets of time interleaved analog-to-digital converters 715 and antennas 705 can be coupled together. For hybrid beamforming, there may be more antennas than sets of time interleaved analog-to-digital converters 715. For example, there may be 4000 antennas 705 and 1000 sets of time interleaved analog-to-digital converter 715, where each set of time interleaved analog-to-digital converter is coupled to four antennas. In other implementations, there can be more sets of time interleaved analog-to-digital converters 715 than antennas 705. For example, there may be 16 antennas 705 and 256 sets of time interleaved analog-to-digital converters 715. In such an implementation, the sets can also be time interleaved providing a 12 dB relaxation (e.g., doubled four times).

The outputs of the time interleaved analog-to-digital converters 720 can be coupled to the beam former 710. In one implementation, the outputs of the time interleaved analog-to-digital converters 720 in respective sets 715 can be coupled to the beam former 710 by respective multiplexors 730.

Sampling of the input signals from respective antennas can be randomly time interleaved between the plurality of time interleaved analog-to-digital converters 720 within respective sets 715, and random between the plurality of sets 715. In one implementation, the sampling control sub-circuits 735 can be configured to control operation of the sets of switching elements 725 to randomly or pseudo randomly couple the input of a respective antenna 705 to an available one of the time interleaved analog-to-digital converters 720 of a respective set 715. In each set, the time interleaved analog-to-digital converters 720 can be instantiated in parallel, each working at Fs/M, wherein M is the number of time interleaved analog-to-digital converters 720 in each set and Fs is the sampling clock frequency, such that the same input signal is sampled at different time instants by a respective time interleaved analog-to-digital converter 720.

Figure 8A:
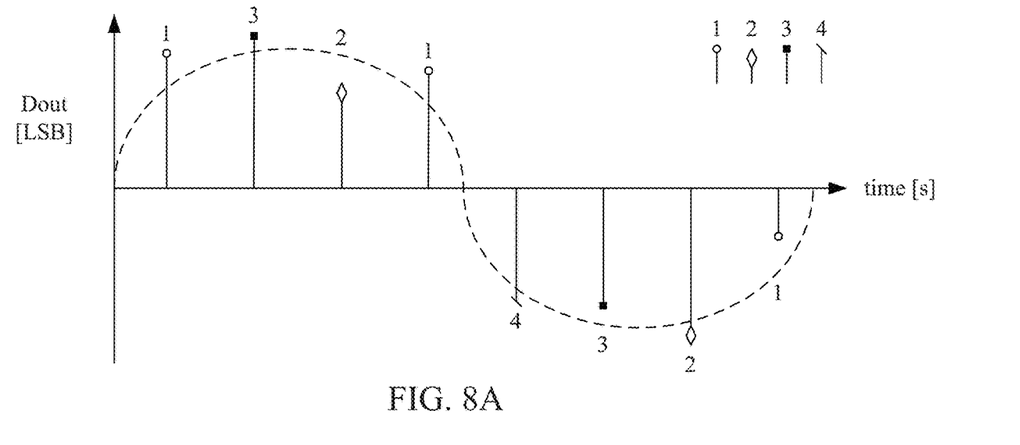
FIGS. 8A, 8B and 8C illustrate an exemplary timing diagram of quantization of an input signal by a plurality of analog-to-digital converters, in accordance with embodiments of the present invention.
Figure 8B:
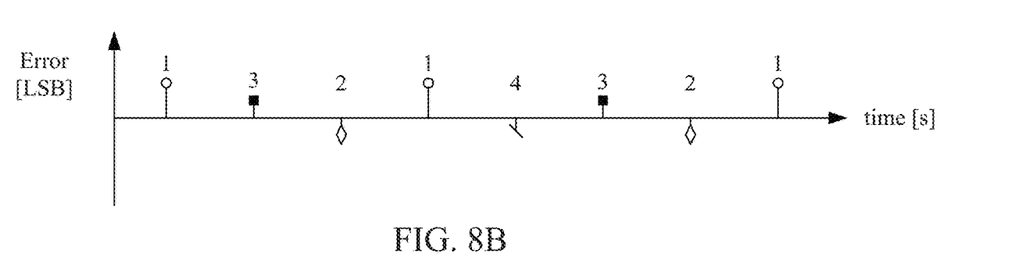
Figure 8C:
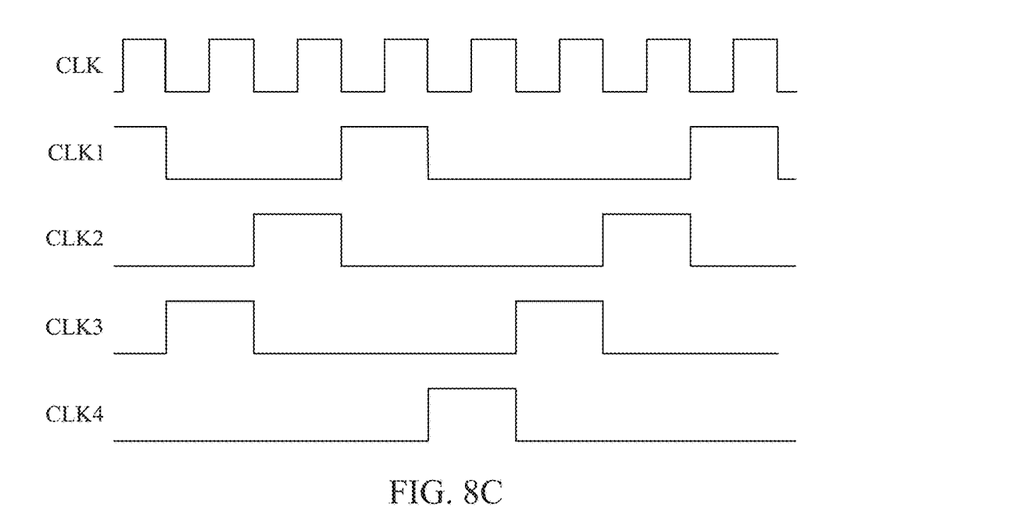

Although FIG. 7 illustrates a sampling control sub-circuit 735 for each respective set 715 of time interleaved analog-to-digital converters 720, the sampling control sub-circuit 735 can be a single integrated sub-circuit shared by the time interleaved analog-to-digital converters 720. Alternatively, one or more portions of the sampling controls sub-circuit 735 can be implemented local to each respective set 715 of time interleaved analog-to-digital converters 720 and one or more portions of the sampling controls sub-circuit 735 can be centralized. The sampling control sub-circuits 735 can also be configured to control corresponding random or pseudo random sampling of the input signals to produce quantized signals by the time interleaved analog-to-digital converters 720 in respective sets 715. For example, the sampling control sub-circuits 735 can provide random or pseudo random sampling signals to the plurality of time interleaved analog-to-digital converters 720 within a respective set 715 to control sampling of the input signal in a random or pseudo random sequence (e.g., 1, 3, 2, 1, 4, 3, 2, 1 . . . ) as illustrated in FIG. 8A. The quantized signal values, however, can be impacted by mismatches between the plurality of time interleaved analog-to-digital converters 720 due to non-ideal effects such as offset, gain error, clock-skew, finite bandwidth mismatches and the like, as illustrated in FIG. 8B. In one implementation, a random or pseudo random bit stream generator of the sampling control sub-circuit 735 can generate the plurality of random sampling signals from an input clock signal, as illustrated in FIG. 8C. The input signal can be tracked by the respective time interleaved analog-to-digital converter 720 on the high level of a respective random sampling signal, sampled on the falling edge of the respective random sampling signal, and converted to the quantized signal value during the low level of the random sampling signal. Each of the time interleaved analog-to-digital converters 720 in a respective set 715 can be operated at a reduced sampling rate as compared to the input clock. Therefore, a higher sampling speed can be achieved by the plurality of time interleaved analog-to-digital converters 720 of each set 715, than is possible for a given technology of the individual analog-to-digital converters 720.

The sampling control sub-circuits 735 can also be configured to control operation of the multiplexors 730 to interleave the quantized signals in respective sets 715 for output to the beam former 710. Phase shifters or time delays 745 of the beam former 710 can shift the quantized signal. The phase shifted quantized values can be combined by the summer 750 of the beam former to produce a phased array output signal 755.

The signal-to-noise ratio (SNR) of the phased array output signal 755 can increase by 3 dB for each doubling of the number of time interleaved analog-to-digital converters 720 in each set 715. The 3 dB increase for each doubling of the number of elements, wherein each element includes one antenna, one analog front-end and one set of time interleaved analog-to-digital converters, is due to the fact that substantially uncorrelated noise, such as capacitance generated thermal noise kT/c and randomized time-interleave mismatch noise, add in $10*\log_{10}(x)$ rather than in $20*\log_{10}(x)$. For example, if a set 715 of random time interleaved analog-to-digital converters 720 includes four time interleaved analog-to-digital converters 720, a 6 dB increase in the signal-to-noise ratio can be achieved with respect to a deterministic time interleaved analog-to-digital converter phased array receiver. If a set 715 of random time interleaved analog-to-digital converters 720 includes eight time interleave analog-to-digital converters 720, a 9 dB increase in the signal-to-noise ratio can be achieved with respect to a deterministic time interleaved analog-to-digital converter phased array receiver.

Figure 9:
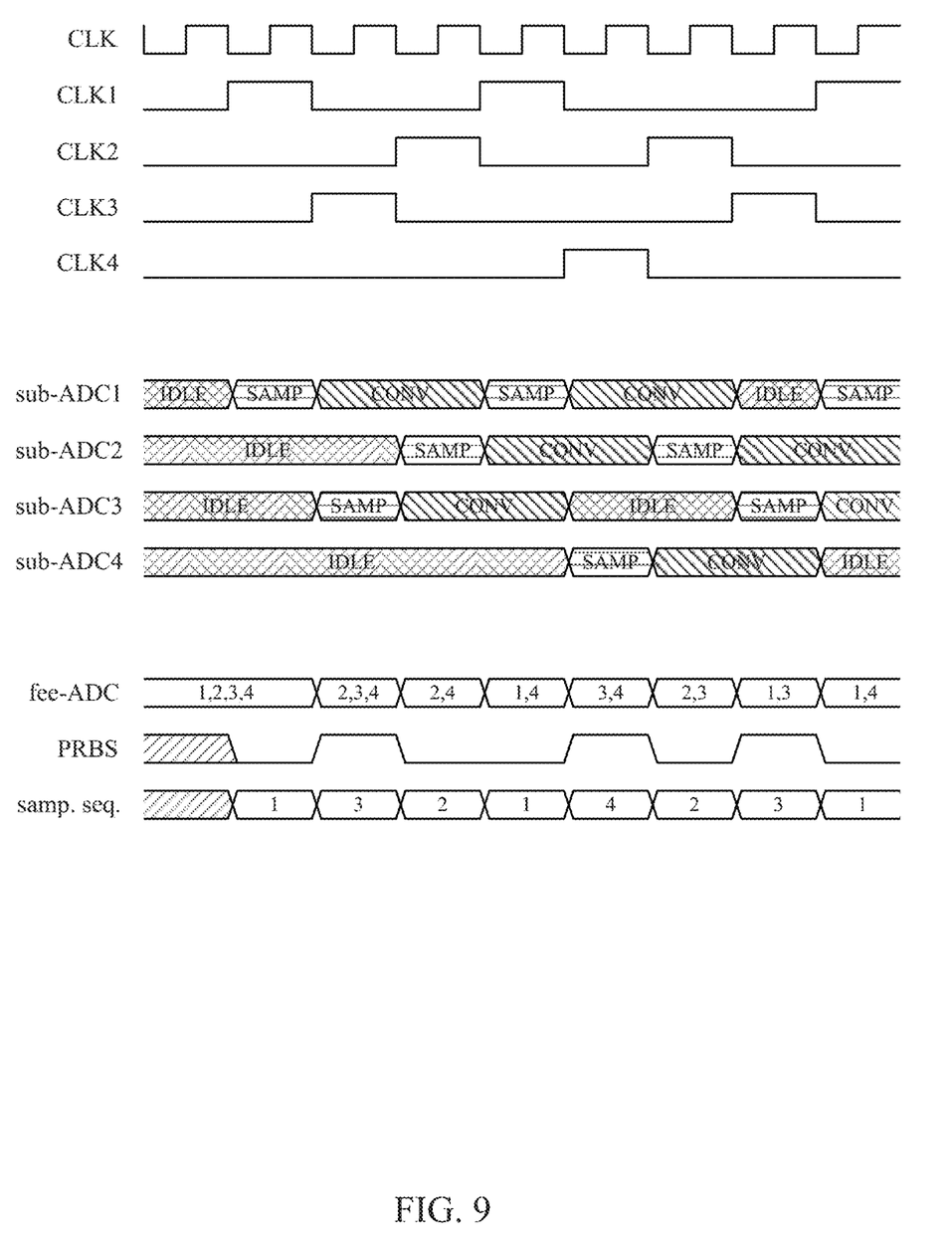
FIG. 9 illustrates an exemplary timing diagram for a set of time interleaved analog-to-digital converters, in accordance with embodiments of the present invention.

Referring now to FIG. 9, an exemplary timing diagram for a set of time interleaved analog-to-digital converters, in accordance with embodiments of the present invention, is shown. The timing diagram illustrates a clock signal and corresponding random or pseudo random sampling signals. The timing diagram also illustrates the corresponding idle, sample and conversion states of the sub-analog-to-digital converters in a given set. The timing diagram also illustrates the current idle sub-analog-to-digital converters and the random or pseudo random selection of one of the current idle sub-analog-to-digital converts for the next sampling and conversion sequence. For example, the sampling control sub-circuit 735 can select from two or more currently available sub-analog-to-digital converters 720 in a set. The random or pseudo random conversion by the plurality of sub-analog-to-digital converters 720 within a set can be orthogonal to the random or pseudo random conversion by the sub-analog-to-digital converters 720 within the other sets 715. The random conversion can be orthogonal by using different random sequences of sub-analog-to-digital converters 720 between the different sets 715.

Figure 10:
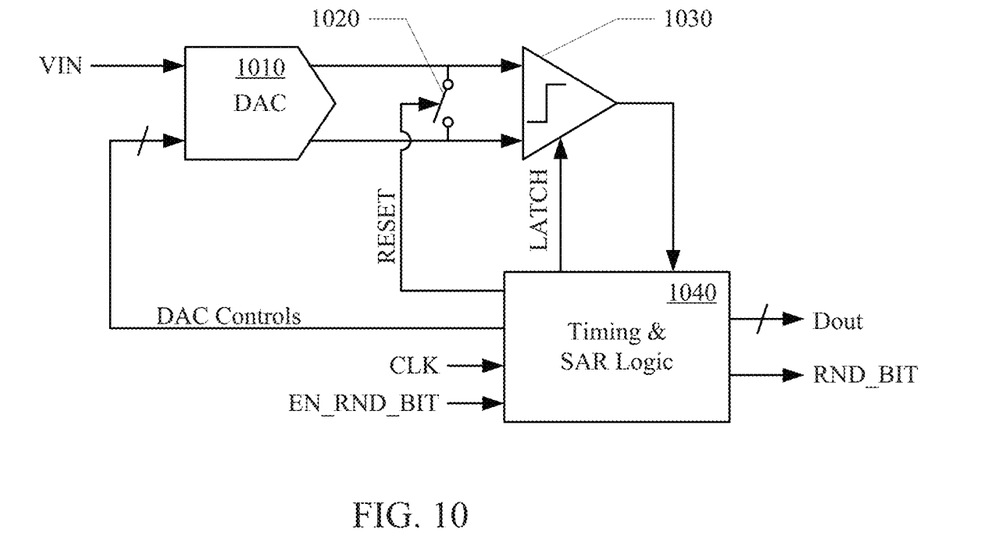
FIG. 10 shows a random bit stream generator, in accordance with embodiments of the present invention.
Figure 11:
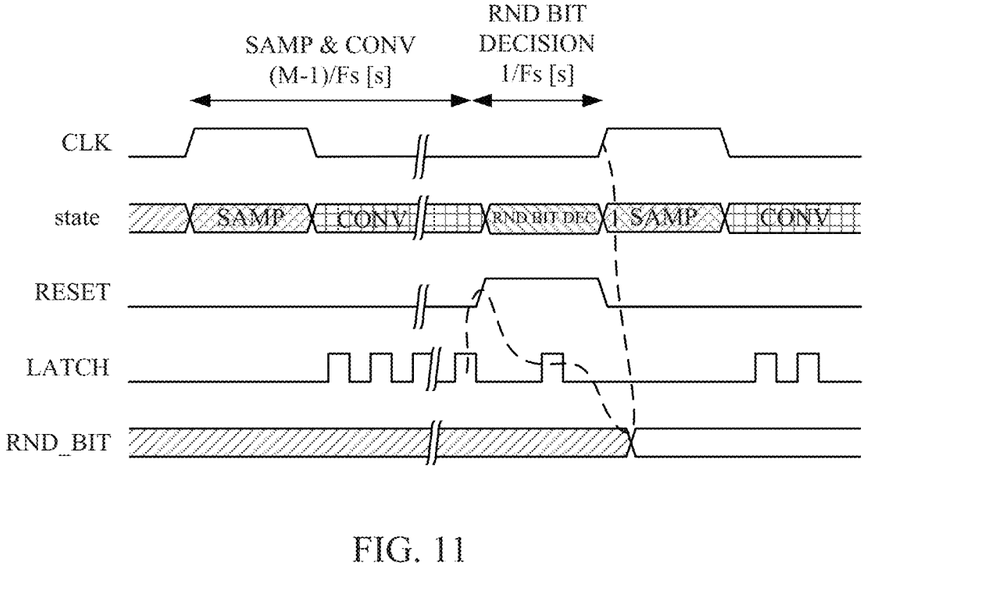
FIG. 11 illustrates generation of an exemplary random bit stream, in accordance with embodiments of the present invention.

Referring now to FIG. 10, a random bit stream generator, in accordance with embodiments of the present invention, is shown. The random bit stream generator 1000 can include a sample and hold digital-to-analog converter 1010, a switching element 1020, a dynamic comparator 1030, and a timing and successive approximation register (SAR) logic 1040. The sample and hold digital-to-analog converter 1010 can receive an input signal Vin and digital-to-analog control signals generated by the timing and successive approximation register logic 1040. The differential output of the sample and hold digital-to-analog converter 1010 can be coupled to the input of the dynamic comparator 1030. The dynamic comparator 1030 can be clocked by a latch signal generated by the timing and successive approximation register logic 1040. The switching element 1020 can be configured to short the differential inputs to the dynamic comparator 1030 based on a reset signal received from the timing and successive approximation register logic 1040. When input referred noise of the comparator 1030 is greater than its input referred offset, taking a bit decision with short circuited inputs produces a random 1 or 0 bit value at the round bit output (RND_BIT) of the timing and successive approximation register logic 1040, as illustrated in FIG. 11. Due to the randomization of the sampling sequence, for each 1/Fs time slot (clock period), 1 out of the N of the time interleave analog-to-digital converters 720 is idle. The idle time can be used to take the extra bit decision as shown in the timing diagram of FIG. 11 illustrating generation of the random bit stream. The method advantageously creates a random bit stream based on comparator input referred noise and thus ensures the sampling sequence of each set 715 of time interleave analog-to-digital converters 720 can be made random with respect to each other. No extra logic block is needed, and therefore no extra chip area is needed. In addition, a small amount of extra power is consumed due to the extra bit decision. The extra bit decision can also be used for comparator offset background calibration.

Figure 12:
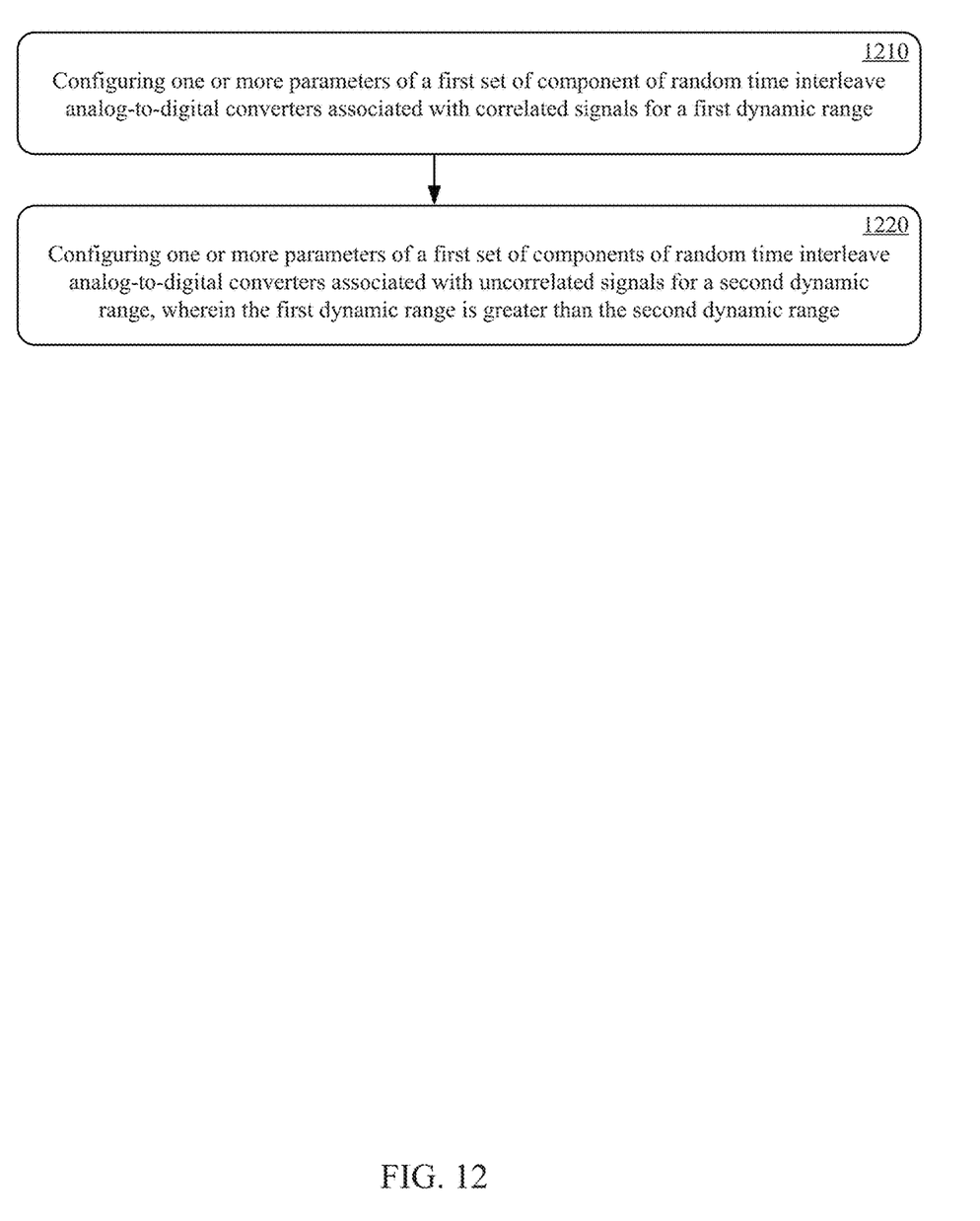
FIG. 12 shows a method of configured a phased array receiver, in accordance with embodiments of the present invention.

Referring now to FIG. 12, a method of configured a phased array receiver, in accordance with embodiments of the present invention, is shown. The method can include configuring one or more parameters of a first set of components of random time interleave analog-to-digital converters for a first dynamic range, at 1210. The first set of components can be associated with substantially correlated signals of the random time interleave analog-to-digital converters. The substantially correlated signals can include harmonic distortion, intermodulation spurious tones and or the like.

At 1220, one or more parameters of a second set of components of the random time interleave analog-to-digital converters can be configured for a second dynamic range, wherein the first dynamic range is greater than the second dynamic range. The second set of components can be associated with substantially uncorrelated signals of the random time interleave analog-to-digital converters. The substantially uncorrelated signals can include thermal noise or the like. For example, when sampling by the time interleave analog-to-digital converters 720 are randomized within sets 715 and between sets 715, time interleave mismatch spurs can be specified at a lower dynamic range level. This can allow for the relaxation of channel mismatch requirements of the time interleave analog-to-digital converters 720, and can avoid the use of a costly and complex time interleave mismatch background calibration engine. By specifying certain parameters of the time interleave analog-to-digital converters 720 that are substantially correlated between elements at a higher dynamic range level and certain substantially uncorrelated parameters at a lower dynamic range level, power consumption can be reduced and or area on the integrated circuit can be reduced. In another example, switches in the switched capacitor network of the analog-to-digital converters 720 generate thermal noise (e.g., kT/C). In accordance with embodiments of the present invention, a smaller sampling capacitor for greater noise can be employed, because the noise is substantially uncorrelated. The lower power is advantageously consumed in the analog-to-digital converters 720 because switching, sampling and driving the smaller capacitors requires less power.

Dynamic element mismatch can be employed in digital-to-analog converters. In one implementation a random bit steam generator to shuffle bits to improve dynamic range of the digital-to-analog converters. In bit shuffling, current sources using for respective bits can be shuffled to push mismatch energy out of band. For example, the current sources can be shuffled between the bits so that the same current source is not always used for the least-significant bit, the next least-significant bit, and so on through to the most-significant bit. By shuffling the bit differently between a plurality of digital-analog converters mismatch effects can be substantially uncorrelated. In one implementation, a plurality of digital-to-analog converters can include a first set of components associated with substantially correlated signals that are configured at a first dynamic range. A second set of components of the plurality of digital-to-analog converters associated with substantially uncorrelated signals that are configured at a second dynamic range, wherein the first dynamic range is greater than the second dynamic range. For example, thermal noise can be specified at a high level and total harmonic distortion (THD) can be specified at a lower level, thereby relaxing the overall requirements and improving power consumption, reducing area on the die, and or the like. The plurality of digital-to-analog converters can include dynamic element matching. A random bit stream generator can be configured to control a sequencing of the dynamic element matching digital-to-analog converters shuffling based on random noise of the circuit. The random noise can be generated in accordance with the circuit described above with reference to FIG. 10. In one implementation, a sequence of the dynamic element matching of the plurality of digital-to-analog converters can be controlled based on random noise of a phase array receiver.

Embodiments of the present invention advantageously reduce performance limitations caused by channel mismatch in analog-to-digital converters for phased array receiver systems. By using random sampling sequences for the analog-to-digital converters, the time interleave channel mismatch error signals from the various analog-to-digital converters are turned into substantially uncorrelated random noise. Because the time interleave channel mismatch error signals from the analog-to-digital converters are random between each other, the energy of the error signals advantageously add in $10*\log_{10}(x)$, rather than $20*\log_{10}(x)$, at the phase array output. Embodiments of the present invention also allow time interleave channel mismatch requirements to be advantageously relaxed to avoid inclusion of a more costly and or complex time interleave mismatch background calibration engine. Embodiments of the present invention can also provide similar advantageous for phased array transmitter circuits, and other similar receiver and transmitter circuits utilizing time interleaved analog-to-digital converters and or dynamic element matched digital to analog converters.

The foregoing descriptions of specific embodiments of the present technology have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the present technology and its practical application, to thereby enable others skilled in the art to best utilize the present technology and various embodiments with various modifications as are suited to the particular use contemplated. It is intended that the scope of the invention be defined by the claims appended hereto and their equivalents.

What is claimed is:

1. A phased array system comprising:
an analog-to-digital signal path including a plurality of sub-paths, wherein one or more parameters of the plurality of sub-paths are substantially correlated from between the plurality of sub-paths and are configured at a first dynamic range level, wherein one or more other parameters of the plurality of sub-paths are substantially uncorrelated between the plurality of sub-paths and are configured at a second dynamic range level, where the first dynamic range level is greater than the second dynamic range level, and wherein the analog-to-digital signal path is configured to add the one or more substantially uncorrelated parameters in $10*\log_{10}$ (x).

2. The phased array system of claim 1, wherein the one or more substantially correlated parameters comprise harmonic and intermodulation spurious tones.

3. The phased array system of claim 2, wherein the one or more substantially uncorrelated parameter comprises thermal noise.

4. The phased array system of claim 1, wherein the analog-to-digital signal path comprises:
a plurality of antennas arranged in an array;
a digital beam former; and
a plurality of compound analog-to-digital converters including respective inputs coupled to respective ones of the plurality of antennas, respective outputs coupled to the digital beam former, wherein each compound analog-to-digital converter includes a plurality of time interleaved sub-analog-to-digital converters, and wherein a sampling sequence by the sub-analog-to-digital converters is random between individual ones of the sub-analog-to-digital converters within respective compound analog-to-digital converters and random between the plurality of compound analog-to-digital converters.

5. The phased array system of claim 4, wherein random sampling by the sub-analog-to-digital converters is orthogonal between the sub-analog-to-digital converters.

6. The phase array system of claim 4, wherein random sampling by the sub-analog-to-digital converters is based on a different random or pseudo random sequences between different compound analog-to-digital converters.

7. The phase array system of claim 4, wherein the sub-analog-to-digital converters sample a signal received at respective inputs of respective compound analog-to-digital converters to generate quantized signals.

8. The phase array system of claim 7, wherein:
the quantized signals from the compound analog-to-digital converters are substantially correlated; and
random error signals of the compound analog-to-digital converters are substantially uncorrelated.

9. The phased array system of claim 4, wherein the sub-analog-to-digital converters comprise successive approximation register analog-to-digital converters.

10. The phase array system of claim 4, wherein a number of the plurality of antennas is different from a number of the plurality of compound analog-to-digital antennas.

11. A circuit comprising:
a plurality of digital-to-analog converters including;
a first set of components of the plurality of digital-to-analog converters associated with substantially correlated signals between individual ones of the plurality of digital-to-analog converters, wherein the substantially correlated signals are configured at a first dynamic range; and
a second set of components of the plurality of digital-to-analog converters associated with substantially uncorrelated signals between individual ones of the plurality of digital-to-analog converters, wherein the substantially uncorrelated signals are configured at a second dynamic range, and wherein the first dynamic range is greater than the second dynamic range.

12. The circuit of claim 11, further comprising
the plurality of digital-to-analog converters with dynamic element matching; and
a random bit stream generator configured to control a sequencing of the dynamic element matching digital-to-analog converters shuffling based on random noise of the circuit.

13. The circuit of claim 12, wherein a sequence of the dynamic element matching of the digital-to-analog converters are controlled based on random noise of a phase array receiver.

* * * * *